United States Patent
Lee et al.

(10) Patent No.: US 10,809,297 B2
(45) Date of Patent: Oct. 20, 2020

(54) EYE OPENING MEASUREMENT CIRCUIT CALCULATING DIFFERENCE BETWEEN SIGMA LEVELS, RECEIVER INCLUDING THE SAME, AND METHOD FOR MEASURING EYE OPENING

(71) Applicant: SAMSUNG ELECTRONICS CO., LTD., Suwon-si, Gyeonggi-Do (KR)

(72) Inventors: June-Hee Lee, Seongnam-si (KR); Byungwook Cho, Hwaseong-si (KR); Bongkyu Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/669,958

(22) Filed: Oct. 31, 2019

(65) Prior Publication Data

US 2020/0064401 A1 Feb. 27, 2020

Related U.S. Application Data

(63) Continuation of application No. 16/181,241, filed on Nov. 5, 2018, now Pat. No. 10,466,301.

(30) Foreign Application Priority Data

May 18, 2018 (KR) .................... 10-2018-0057065

(51) Int. Cl.
*H04B 17/00* (2015.01)
*H04L 25/03* (2006.01)
(Continued)

(52) U.S. Cl.
CPC ........ *G01R 31/31703* (2013.01); *H04B 1/16* (2013.01)

(58) Field of Classification Search
CPC ..... H04L 1/0015; H04L 1/20; H04L 25/0292; H04L 25/03019; H04L 25/03057;
(Continued)

(56) References Cited

U.S. PATENT DOCUMENTS 7,286,597 B2    10/2007    Buchwald
7,315,598 B2    1/2008     Lee et al.
(Continued)

FOREIGN PATENT DOCUMENTS

KR    1020160089922 A    7/2016
KR    101684801 B1       12/2016

*Primary Examiner* — Quochien B Vuong
(74) *Attorney, Agent, or Firm* — Volentine, Whitt & Francos, PLLC

(57) ABSTRACT

A receiver includes a sampler that samples first voltage levels corresponding to a first logical value of data and second voltage levels corresponding to a second logical value of the data, based on a sampling clock. An equalizer receives and adjusts the first and second voltage levels. A clock and data recovery circuit recovers the sampling clock, based on the first and second voltage levels from the equalizer. An eye opening measurement circuit: (1) tracks a first sigma level by a first step unit depending on upper voltage levels greater than a first reference voltage level among the first voltage levels, (2) tracks a second sigma level by a second step unit depending on lower voltage levels less than a second reference voltage level among the second voltage levels, and (3) calculates a difference between the first sigma level and the second sigma level.

20 Claims, 10 Drawing Sheets

(51) Int. Cl.
*G01R 31/317* (2006.01)
*H04B 1/16* (2006.01)

(58) Field of Classification Search
CPC ......... H04L 25/03267; H04L 25/03885; H04L 25/067; H04L 27/01; H04L 27/06; H04L 27/14; H04L 2025/03433; H04L 2025/03681; H04B 1/04; H04B 1/10; H04B 1/16; H04B 3/145

See application file for complete search history.

(56) References Cited

U.S. PATENT DOCUMENTS

| | | | |
|---|---|---|---|
| 7,400,694 | B1 | 7/2008 | Sonntag et al. |
| 7,522,661 | B2 | 4/2009 | Nelson et al. |
| 7,639,736 | B2 | 12/2009 | Farad-Rad |
| 7,697,649 | B2 | 4/2010 | Okamura |
| 7,812,749 | B2 | 10/2010 | Abel et al. |
| 7,852,915 | B2 * | 12/2010 | Chen ................ H04L 25/03038 375/233 |
| 8,300,684 | B2 | 10/2012 | Mobin et al. |
| 8,804,885 | B2 * | 8/2014 | Banna ............... H04L 25/03038 375/147 |
| 9,020,082 | B2 * | 4/2015 | Hidaka ............. H04L 25/03057 375/144 |
| 9,077,593 | B2 | 7/2015 | Chaivipas |
| 9,166,771 | B2 | 10/2015 | Shibasaki |
| 10,014,907 | B2 | 7/2018 | Choi |
| 10,033,555 | B2 | 7/2018 | Schell |
| 2010/0097087 | A1 | 4/2010 | Hogeboom et al. |
| 2016/0209462 | A1 | 7/2016 | Choi et al. |
| 2017/0250840 | A1 | 8/2017 | Aleksic et al. |

* cited by examiner

EYE OPENING MEASUREMENT CIRCUIT CALCULATING DIFFERENCE BETWEEN SIGMA LEVELS, RECEIVER INCLUDING THE SAME, AND METHOD FOR MEASURING EYE OPENING

CROSS-REFERENCE TO RELATED APPLICATIONS

This is a Continuation of U.S. application Ser. No. 16/181,241, filed Nov. 5, 2018, which issued as U.S. Pat. No. 10,466,301, on Nov. 5, 2019, and which claims priority under 35 U.S.C. § 119 to Korean Patent Application No. 10-2018-0057065 filed on May 18, 2018, in the Korean Intellectual Property Office, the disclosure of which is incorporated by reference herein in its entirety.

BACKGROUND

Embodiments of the disclosure relate to an eye opening measurement circuit, a receiver including the same, and a method for measuring an eye opening, and more particularly, relate to an eye opening measurement circuit calculating a difference between sigma levels, a receiver including the same, and a method for measuring an eye opening.

In a high-speed serial link system, bits of data may be transmitted in series through a channel. A bandwidth of the channel may be limited due to a skin effect, a dielectric loss, etc. To compensate for the limited bandwidth of the channel, each of a transmitter to transmit data through the channel and a receiver to receive data through the channel may include an equalizer for compensating for a channel loss.

An eye diagram of a signal equalized by the equalizer of the transmitter may be checked by probing an output terminal of the transmitter. However, an eye diagram of a signal equalized by the equalizer of the receiver cannot be checked by using the probing because the equalized signal is internally processed. Accordingly, there is a need for technology which may check the eye diagram of the signal equalized by the equalizer of the receiver.

SUMMARY

Embodiments of the disclosure provide an eye opening measurement circuit calculating a difference between sigma levels, a receiver including the same, and a method for measuring an eye opening.

According to an exemplary embodiment, a receiver includes a sampler that samples first voltage levels corresponding to a first logical value of data and second voltage levels corresponding to a second logical value of the data, based on a sampling clock. An equalizer receives and adjusts the first and second voltage levels. A clock and data recovery circuit recovers the sampling clock, based on the first and second voltage levels received from the equalizer. An eye opening measurement circuit: (1) tracks a first sigma level by a first step unit depending on upper voltage levels, which are greater than a first reference voltage level, from among the first voltage levels, (2) tracks a second sigma level by a second step unit depending on lower voltage levels, which are less than a second reference voltage level, from among the second voltage levels, and (3) calculates a difference between the first sigma level and the second sigma level.

According to another exemplary embodiment, a receiver includes an equalizer and a measurement circuit. The equalizer generates an equalized signal by equalizing a signal with a multi-tap filter to compensate for an effect of communicating the signal through a channel. The measurement circuit generates a quality measure of the equalization applied to the signal by measuring the equalized signal. The equalizer modifies a coefficient of a tap of the multi-tap filter, based upon the quality measure, to improve equalization applied to compensate a subsequent signal communicated through the channel.

According to another exemplary embodiment, an electronic circuit includes a multiplexer and a processor circuit. The multiplexer receives a signal comprising a serial transmission of instances of a first symbol and instances of a second symbol and conveys the instances of the first symbol to a first register and conveys the instances of the second symbol to a second register. The processor circuit includes the first register, the second register, and an adder. For each of a plurality of iterations: (1) the first register stores a first representation that is centered among second representations of instances of the first symbol within the signal having magnitudes that are less than a first reference value, (2) the second register stores a third representation that is centered among fourth representations of instances of the second symbol within the signal having magnitudes that are greater than a second reference value, and (3) the adder generates a first difference between the first representation and the third representation.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
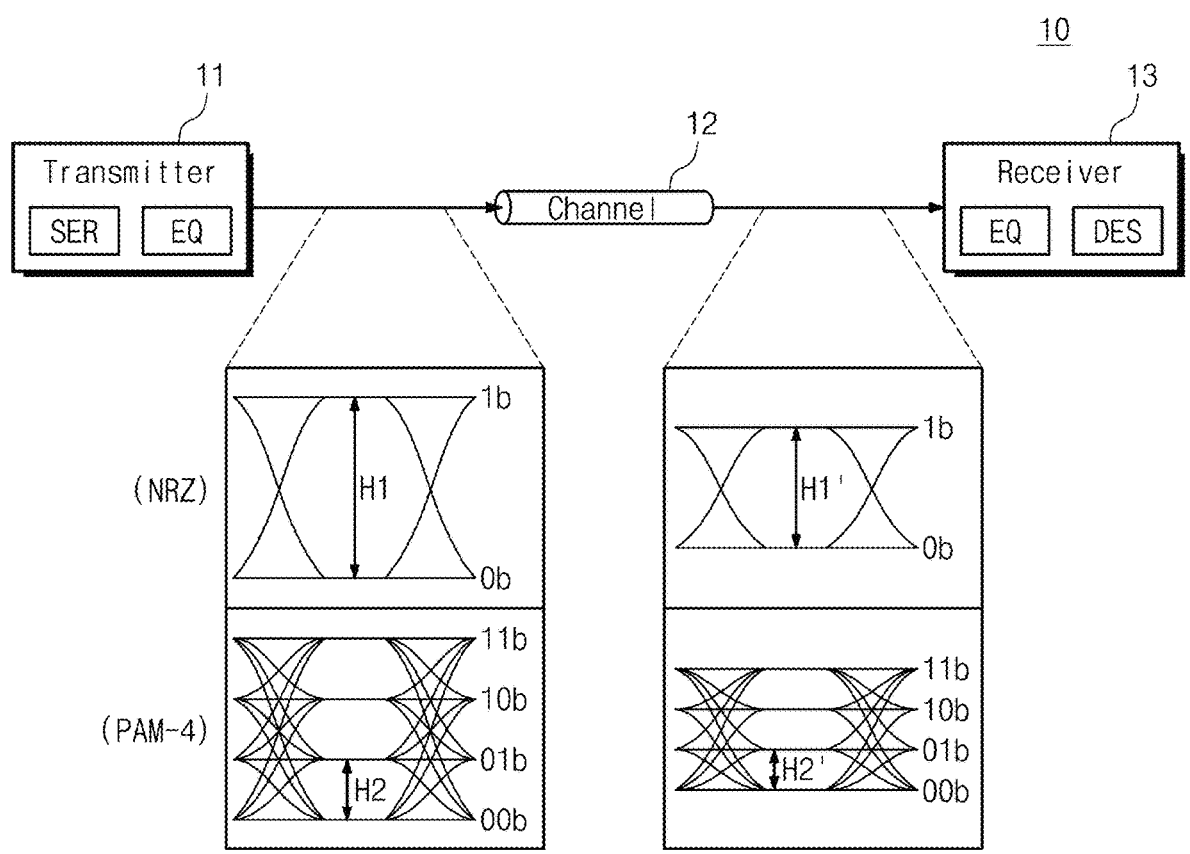
FIG. 1 is a block diagram illustrating a transceiver according to an embodiment of the disclosure.

FIG. 1 is a block diagram illustrating a transceiver according to an embodiment of the disclosure. A transceiver 10 may include a transmitter 11 and a receiver 13 which communicate with each other through a channel 12. The transmitter 11 may include a serializer SER which converts parallel data to serial data, and the receiver 13 may include a deserializer DES which converts the serial data transmitted through the channel 12 from the transmitter 11 to the parallel data. The transceiver 10 including the serializer SER and the deserializer DES may be referred to as a "data transmitting/receiving circuit", a "serializer/deserializer (SERDES) circuit", a "high-speed data transmission system", etc.

The transmitter 11 may transmit a signal corresponding to data to the receiver 13 through the channel 12. The transmitter 11 may further include an equalizer EQ for compensating for a channel loss in addition to the serializer SER. For example, voltage levels of a signal which is equalized or adjusted by the equalizer EQ of the transmitter 11 may be checked by probing a path connecting an output terminal of the transmitter 11 and an input terminal of the channel 12.

In an embodiment, the transmitter 11 may transmit a signal in a non-return-to-zero (NRZ) signaling scheme or a four-level pulse amplitude modulation (PAM-4) signaling scheme. In the NRZ signaling scheme, the transmitter 11 may transmit a signal having voltage levels corresponding to first and second logical values (e.g., 0b and 1b) of data. In the PAM-4 signaling scheme, the transmitter 11 may transmit a signal having voltage levels corresponding to first to fourth logical values (e.g., 00b, 01b, 10b, and 11b) of data. At the same data rate, a bandwidth of the transmitter 11 using the PAM-4 signaling scheme may increase two times compared to the NRZ signaling scheme; however, a difference between voltage levels associated with the PAM-4 signaling scheme may decrease three times compared to the NRZ signaling scheme.

The signaling scheme of the transmitter 11 is not limited to the above examples. For example, in the case where a signaling scheme such as PAM-8 or PAM-16 is applied to the transmitter 11, voltage levels of a signal output from the transmitter 11 may correspond to four or more logical values. Looking at a signal output from the output terminal of the transmitter 11 of FIG. 1, overlapped waveforms in which bits of data are transmitted in series may be similar to an eye shape. In general, a height of an eye opening may be measured to evaluate the transceiving (transmitting and receiving) performance of the transceiver 10.

The channel 12 may be an electrical path which connects the transmitter 11 and the receiver 13 for communication between the transmitter 11 and the receiver 13. For example, the channel 12 may include a trace of a printed circuit board (PCB) or a coaxial cable. The channel 12 may worsen high-frequency contents of high-speed random data transmitted through the channel 12 due to a skin effect, a dielectric loss, etc. That is, a channel loss may occur in the signal transmitted through the channel 12. Also, the channel 12 may cause impedance discontinuity (mismatch) due to connectors between boards and cables, and any other physical interfaces. The impedance discontinuity of the channel 12 may appear as a notch at a frequency response of the channel 12. Also, each of bits of data passing through the channel 12 may disturb a next bit due to the channel loss or a limited bandwidth, and a phenomenon in which a bit error rate increases due to overlapping of neighboring symbols, that is, an inter symbol interference (ISI) may occur.

Eye diagrams of a signal which is output from the output terminal of the transmitter 11 and does not pass through the channel 12 are illustrated in FIG. 1. Although not illustrated in FIG. 1, a horizontal axis of the eye diagrams may represent time, and a vertical axis of the eye diagrams may represent a voltage level. A height of an eye opening in the NRZ signaling scheme may be H1, and a height of an eye opening in the PAM-4 signaling scheme may be H2 (approximately one third of H1). Here, a unit of the height of the eye opening may be a voltage level. Eye diagrams of a signal which is output from the output terminal of the transmitter 11 and passes through the channel 12 (i.e., is input to an input terminal of the receiver 13) are further illustrated in FIG. 1. The height of the eye opening in the received NRZ signaling scheme may be H1', and the height of the eye opening in the received PAM-4 signaling scheme may be H2'. The height of the eye opening may decrease due to the channel loss. For example, H1 may decrease to H1', and H2 may decrease to H2'.

The receiver 13 may receive a signal of data through the channel 12. The receiver 13 may further include an equalizer EQ having an opposite characteristic to a characteristic of the channel 12 for compensating for the channel loss in addition to the deserializer DES. For example, the channel 12 may have a characteristic of a frequency response like a low pass filter, and the equalizer EQ of the receiver 13 may have a characteristic of a frequency response like a high pass filter.

Eye diagrams at the output terminal of the transmitter 11 and eye diagrams at an input terminal of the receiver 13 are illustrated in FIG. 1, respectively. As described above, how much the transmitter 11 compensates for the channel loss may be checked by probing an eye diagram at the output terminal of the transmitter 11. In contrast, even though the receiver 13 compensates for the channel loss of the received signal, how much the receiver 13 compensates for the channel loss cannot be checked through the probing. Accordingly, there is a need for a circuit which may check how much the receiver 13 compensates for the channel loss and may be implemented within the receiver 13, that is, an eye opening measurement circuit.

Figure 2:
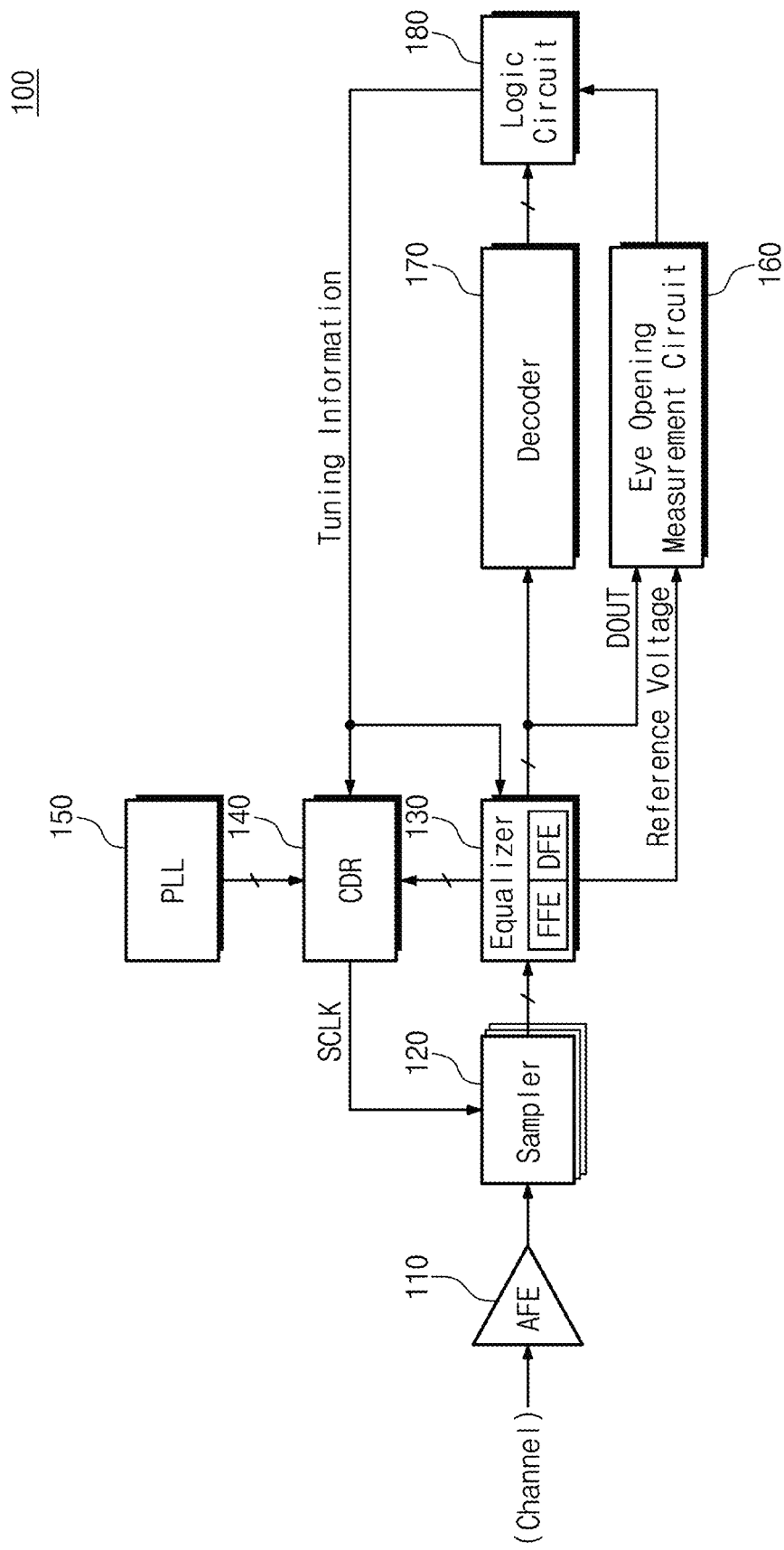
FIG. 2 is a block diagram illustrating a receiver of FIG. 1.

FIG. 2 is a block diagram illustrating a receiver of FIG. 1. FIG. 2 will be described with reference to FIG. 1. A receiver 100 may include an analog front end (AFE) 110, a sampler 120, an equalizer 130, a clock and data recovery (CDR) circuit 140, a phase locked loop (PLL) 150, an eye opening measurement circuit 160, a decoder 170, and a logic circuit 180.

The analog front end 110 may receive a signal transmitted through the channel 12 and may transmit or provide the received signal to the sampler 120. For example, the analog front end 110 may be an analog signal processing circuit including at least one amplifier, which amplifies the received signal, such as a low noise amplifier (LNA) or a variable gain amplifier (VGA).

The sampler 120 may receive the signal processed by the analog front end 110. The sampler 120 may sample voltage levels of a signal based on a sampling clock SCLK. In detail, in the NRZ signaling scheme, the sampler 120 may sample voltage levels corresponding to a first logical value (e.g., 0b) of data and voltage levels corresponding to a second logical value (e.g., 1b) of the data. In the PAM-4 signaling scheme, the sampler 120 may sample voltage levels corresponding to a first logical value (e.g., 00b) of data, voltage levels corresponding to a second logical value (e.g., 01b) of the data, voltage levels corresponding to a third logical value (e.g., 10b) of the data, and voltage levels corresponding to a fourth logical value (e.g., 11b) of the data. The sampler 120 may provide voltage levels sampled in the form of analog signals or in the form of digital signals to the equalizer 130. For example, the sampler 120 may include at least one analog-to-digital converter (ADC) which converts a signal received from the analog front end 110 to a signal of a digital form based on the sampling clock SCLK. As illustrated in FIG. 2, the number of samplers 120 may be at least one.

The equalizer 130 may receive voltage levels of a signal corresponding to logical values of data. The equalizer 130 may adjust the received voltage levels for compensating for the channel loss. That is, the equalizer 130 may increase a height of an eye opening by removing or suppressing noise, jitter, ISI, etc. due to the channel 12 and compensating for the channel loss. For example, the equalizer 130 may include a decision-feedback equalizer (DFE) which is a non-linear equalizer and a feed-forward equalizer (FFE) which is a linear equalizer.

For example, it is assumed that a unit interval UI (i.e., a 1-bit interval) of the signal transmitted through the channel 12 is "T". At an impulse response of the channel 12, the above-described ISI of the channel 12 may cause postcursors at times corresponding to an integer multiple of "T" such as T, 2T, 3T, and the like. The DFE of the equalizer 130 may multiply a voltage level of the received signal and magnitudes (e.g., DFE coefficients) of the postcursors together and may add the multiplication results. Next, the equalizer 130 may suppress the ISI due to the postcursors by subtracting the addition result from a voltage level of a newly received signal. The DFE of the equalizer 130 may include as many taps as the number of DFE coefficients. In this case, the DFE may be referred to as an "n-tap DFE" (n being a natural number). For example, the DFE of the equalizer 130 may include a slicer or a flip-flop for decision, a multiplier, and an adder.

The FFE of the equalizer 130 may remove precursors and postcursors which are out of a time range for which the DFE may compensate. That is, the FFE may supplement the DFE. The FFE of the equalizer 130 may delay received signals, may multiply the delayed signals and the FFE coefficients together, may add the multiplication results, and may provide the addition result to the DFE. Since the FFE of the equalizer 130 is within the receiver 100, the FFE coefficients may be adaptively adjusted based on the signal received through the channel 12. Of course, as with the FFE coefficients, the DFE coefficients may be adaptively adjusted. The FFE of the equalizer 130 may include as many taps as the number of FFE coefficients. In this case, the FFE may be referred to as an "m-tap FFE". Here, "m" may be a natural number and may be identical to or different from "n". For example, the FFE of the equalizer 130 may include a delay cell to delay a signal, a multiplier, and an adder.

The clock and data recovery circuit 140 may receive voltage levels of output data DOUT from the equalizer 130. The voltage levels of the output data DOUT may be equalized or adjusted based on the above-described operation of the equalizer 130. The clock and data recovery circuit 140 may receive clocks having multiple phases provided from the phase locked loop 150. The clock and data recovery circuit 140 may generate, adjust, or recover the sampling clock SCLK based on the voltage levels of the output data DOUT and the clocks having the multiple phases. The sampling clock SCLK may also be referred to as a "recovery clock". A signal provided from the analog front end 110 may be sampled by the sampler 120 at a rising edge or a falling edge of the sampling clock SCLK.

The clock and data recovery circuit 140 may adjust a sampling point of the sampler 120 by adjusting a phase of the sampling clock SCLK. For example, the clock and data recovery circuit 140 may include a phase interpolator which mixes the clocks of the multiple phases provided from the phase locked loop 150 based on the voltage levels equalized or adjusted by the equalizer 130.

The phase locked loop 150 may generate the clocks having the multiple phases and may provide the clocks to the clock and data recovery circuit 140. For example, the phase locked loop 150 may include a phase detector PD to compare a reference clock with one of the generated clocks, a loop filter, a voltage controlled oscillator VCO or a digitally controlled oscillator DCO, and the like. Here, the reference clock may be received from the outside of the receiver 100 or may be generated within the receiver 100.

The eye opening measurement circuit 160 may perform an operation of measuring a height of an eye opening after the equalizer 130 and the clock and data recovery circuit 140 are locked. For example, coefficients (FFE coefficients or DFE coefficients) of the equalizer 130 after the locking may be fixed, and a phase change of the sampling clock SCLK output from the clock and data recovery circuit 140 after the locking may be within a range determined in advance. The height of the eye opening measured by the eye opening measurement circuit 160 may be used to determine how much the equalizer 130 and the clock and data recovery circuit 140 remove noise, jitter, ISI, etc. and compensate for the channel loss.

The eye opening measurement circuit 160 may receive voltage levels of the output data DOUT from the equalizer 130. Also, the eye opening measurement circuit 160 may receive a reference voltage level from the equalizer 130. The reference voltage level may be a center level or an average level of voltage levels corresponding to any one of logical values of the output data DOUT.

In the NRZ signaling scheme, each of a center level of voltage levels corresponding to a first logical value 0b of the output data DOUT and a center level of voltage levels corresponding to a second logical value 1b of the output data DOUT may be the reference voltage level. For example, the reference voltage level which is the center level of the voltage levels corresponding to the second logical value 1b may correspond to the magnitude of a main cursor of an impulse response of the channel 12 or to C0 of the equalizer 130. The eye opening measurement circuit 160 may calculate a reference voltage level −C0 of the voltage levels corresponding to the first logical value 0b by using the reference voltage level C0 of the voltage levels which correspond to the second logical value 1b and are provided from the equalizer 130.

In the PAM-4 signaling scheme, each of a center level of voltage levels corresponding to a first logical value 00b of the output data DOUT, a center level of voltage levels corresponding to a second logical value 01b of the output data DOUT, a center level of voltage levels corresponding to a third logical value 10b of the output data DOUT, and a center level of voltage levels corresponding to a fourth logical value 11b of the output data DOUT may be the reference voltage level. For example, the reference voltage level which is the center level of the voltage levels corresponding to the third logical value 10b may correspond to the magnitude of the main cursor of the impulse response of the channel 12 or to C0 of the equalizer 130. The eye opening measurement circuit 160 may calculate a reference voltage level −3C0 of the voltage levels corresponding to the first logical value 00b, a reference voltage level −C0 of the voltage levels corresponding to the second logical value 01b, a reference voltage level 3C0 of the voltage levels corresponding to the fourth logical value 11b by using the reference voltage level C0 of the voltage levels which correspond to the third logical value 10b and are provided from the equalizer 130.

Voltage levels corresponding to any one of logical values of the output data DOUT may be distributed with the reference voltage level as the center. The eye opening measurement circuit 160 according to an embodiment of the disclosure may not measure the height of the eye opening based on a maximum level and a minimum level of such voltage levels. Instead, the eye opening measurement circuit 160 may measure the height of the eye opening based on a minimum sigma level Sigma_Min which is greater than the minimum level and is less than the reference voltage level and a maximum sigma level Sigma_Max which is less than the maximum level and is greater than the reference voltage level. Here, a deviation of the minimum sigma level Sigma_Min from the reference voltage level may be identical to or different from a deviation of the maximum sigma level Sigma_Max from the reference voltage level. Below, a method in which the eye opening measurement circuit 160 calculates the minimum sigma level Sigma_Min, the maximum sigma level Sigma_Max, and the height of the eye opening will be described with reference to FIGS. 3 to 8.

The decoder 170 may receive the voltage levels of the output data DOUT provided from the equalizer 130. The decoder 170 may decode the voltage levels of the output data DOUT to symbols. The decoder 170 may provide the symbols to the logic circuit 180.

The logic circuit 180 may receive and process the symbols from the decoder 170. For example, for processing symbols, the logic circuit 180 may include at least one of a central processing unit (CPU), an image signal processing unit (ISP), a digital signal processing unit (DSP), a graphics processing unit (GPU), a vision processing unit (VPU), and a neural processing unit (NPU). Also, the logic circuit 180 may include homogeneous multi-core processors or heterogeneous multi-core processors.

The logic circuit 180 may receive the height of the eye opening from the eye opening measurement circuit 160. The logic circuit 180 may adjust or optimize the equalizer 130 and the clock and data recovery circuit 140 based on the height of the eye opening. For example, the logic circuit 180 may provide tuning information to the equalizer 130 and the clock and data recovery circuit 140 for training on the equalizer 130 and the clock and data recovery circuit 140. For example, coefficients (e.g., FFE coefficients and DFE coefficients) of the equalizer 130, coefficients of the clock and data recovery circuit 140, etc. may be changed depending on the tuning information (or one or more signals for tuning). In the case where it is determined that the height of the eye opening is insufficient, the logic circuit 180 may adjust the equalizer 130 and the clock and data recovery circuit 140 to improve the height of the eye opening.

In an embodiment, all or a part of the components 110, 120, 130, 140, 150, 160, 170, and 180 of the receiver 100 may be implemented with a system on chip (SoC), an application specific integrated circuit (ASIC), a field programmable gate array (FPGA), etc. For example, the receiver 100 may be implemented by using various packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), wafer-level processed stack package (WSP), etc.

Figure 3:
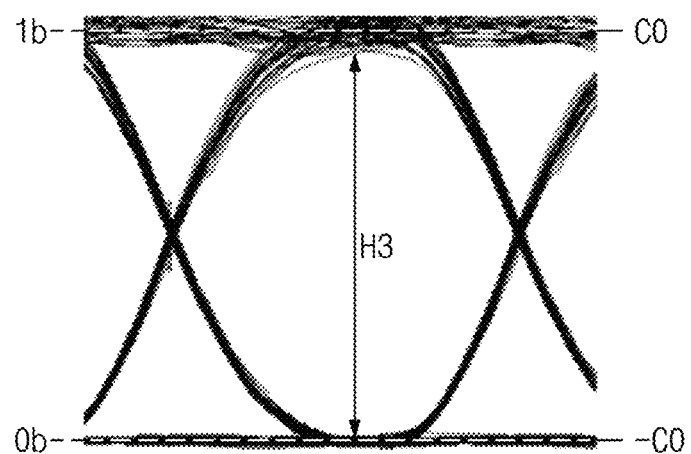
FIGS. 3 and 4 illustrate eye diagrams of voltage levels input to an eye opening measurement circuit of FIG. 2 in an NRZ signaling scheme.
Figure 4:
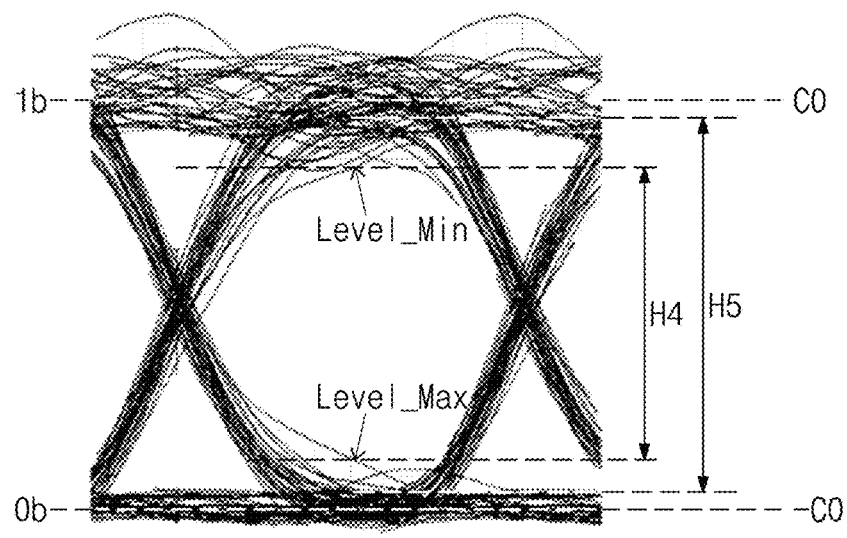

FIGS. 3 and 4 illustrate eye diagrams of voltage levels input to an eye opening measurement circuit of FIG. 2 in an NRZ signaling scheme. FIGS. 3 and 4 will be described together and will be described with reference to FIGS. 1 and 2. Although not illustrated in FIGS. 3 and 4, a horizontal axis of the eye diagrams may represent time, and a vertical axis of the eye diagrams may represent a voltage level.

Referring to FIGS. 3 and 4, the majority of voltage levels may be distributed with respect to the center levels C0 and −C0. It is assumed that the dispersion of the voltage levels of FIG. 3 may be smaller than the dispersion of the voltage levels of FIG. 4 and the standard deviation of the voltage levels of FIG. 3 is smaller than the standard deviation of the voltage levels of FIG. 4.

The eye opening measurement circuit 160 may measure a height of an eye opening of the eye diagram of FIG. 3. In the case where the eye opening measurement circuit 160 measures the height of the eye opening based on the minimum level and the maximum level of the voltage levels, the height of the eye opening may be H3. In the case where the eye opening measurement circuit 160 measures the height of the eye opening based on the minimum sigma level Sigma_Min and the maximum sigma level Sigma_Max, the height of the eye opening may be similar to H3. According to the above assumption, since the dispersion of the voltage levels of FIG. 3 is smaller than the dispersion of the voltage levels of FIG. 4, a difference between the majority of voltage levels and the minimum level and a difference between the majority of voltage levels and the maximum level may be small. Accordingly, in the case of FIG. 3, there is little difference between the height of the eye opening measured by the eye opening measurement circuit 160 based on the minimum level and the maximum level and the height of the eye opening measured by the eye opening measurement circuit based on the minimum sigma level Sigma_Min and the maximum sigma level Sigma_Max.

The eye opening measurement circuit 160 may measure a height of an eye opening of the eye diagram of FIG. 4. Unlike the eye diagram of FIG. 3, in the eye diagram of FIG. 4, due to a transient error or noise, a difference between the majority of voltage levels and the minimum level and a difference between the majority of voltage levels and the maximum level may be greater than in the case of FIG. 3.

In the case where the eye opening measurement circuit 160 measures the height of the eye opening based on the minimum level Level_Min and the maximum level Level_Max of the voltage levels, the height of the eye opening may be H4. In the case where the eye opening measurement circuit 160 measures the height of the eye opening based on the minimum sigma level Sigma_Min and the maximum sigma level Sigma_Max, the height of the eye opening may be H5 greater than H4. It is assumed that the logic circuit 180 may perform optimization on the equalizer 130 and the clock and data recovery circuit 140 based on the height H4 of the eye opening or the height H5 of the eye opening provided from the eye opening measurement circuit 160.

Since the height H4 of the eye opening is smaller than the height H5 of the eye opening, the degree of optimization performed on the equalizer 130 and the clock and data recovery circuit 140 based on the height H4 of the eye opening may be greater than the degree of optimization performed on the equalizer 130 and the clock and data recovery circuit 140 based on the height H5 of the eye opening. However, since the height H4 of the eye opening is due to the transient error or noise, in the case where a height of an eye opening measured by the eye opening measurement circuit 160 based on the minimum level Level_Min and the maximum level Level_Max of the voltage levels is H4, the logic circuit 180 may excessively perform optimization on the equalizer 130 and the clock and data recovery circuit 140. That is, the logic circuit 180 may unnecessarily adjust the equalizer 130 and the clock and data recovery circuit 140, and such adjustment may have a negative influence on a height of an eye opening formed by the majority of the voltage levels except for the minimum level and the maximum level.

To sum up, the minimum level Level_Min and the maximum level Level_Max cannot indicate the majority of the voltage levels, but the minimum sigma level Sigma_Min and the maximum sigma level Sigma_Max may indicate the majority of the voltage levels. For improving tolerance to a transient error or noise, the eye opening measurement circuit 160 according to an embodiment of the disclosure may measure a height of an eye opening based on the minimum sigma level Sigma_Min and the maximum sigma level Sigma_Max instead of the minimum level Level_Min and the maximum level Level_Max. Accordingly, the logic circuit 180 may adjust or optimize the equalizer 130 and the clock and data recovery circuit 140 based on the height H5 of the eye opening, not the height H4 of the eye opening. The logic circuit 180 may not perform unnecessary adjustment of the equalizer 130 and the clock and data recovery circuit 140 due to a transient error or noise. Below, a method in which the eye opening measurement circuit 160 tracks the minimum sigma level Sigma_Min and the maximum sigma level Sigma_Max will be described.

Figure 5:
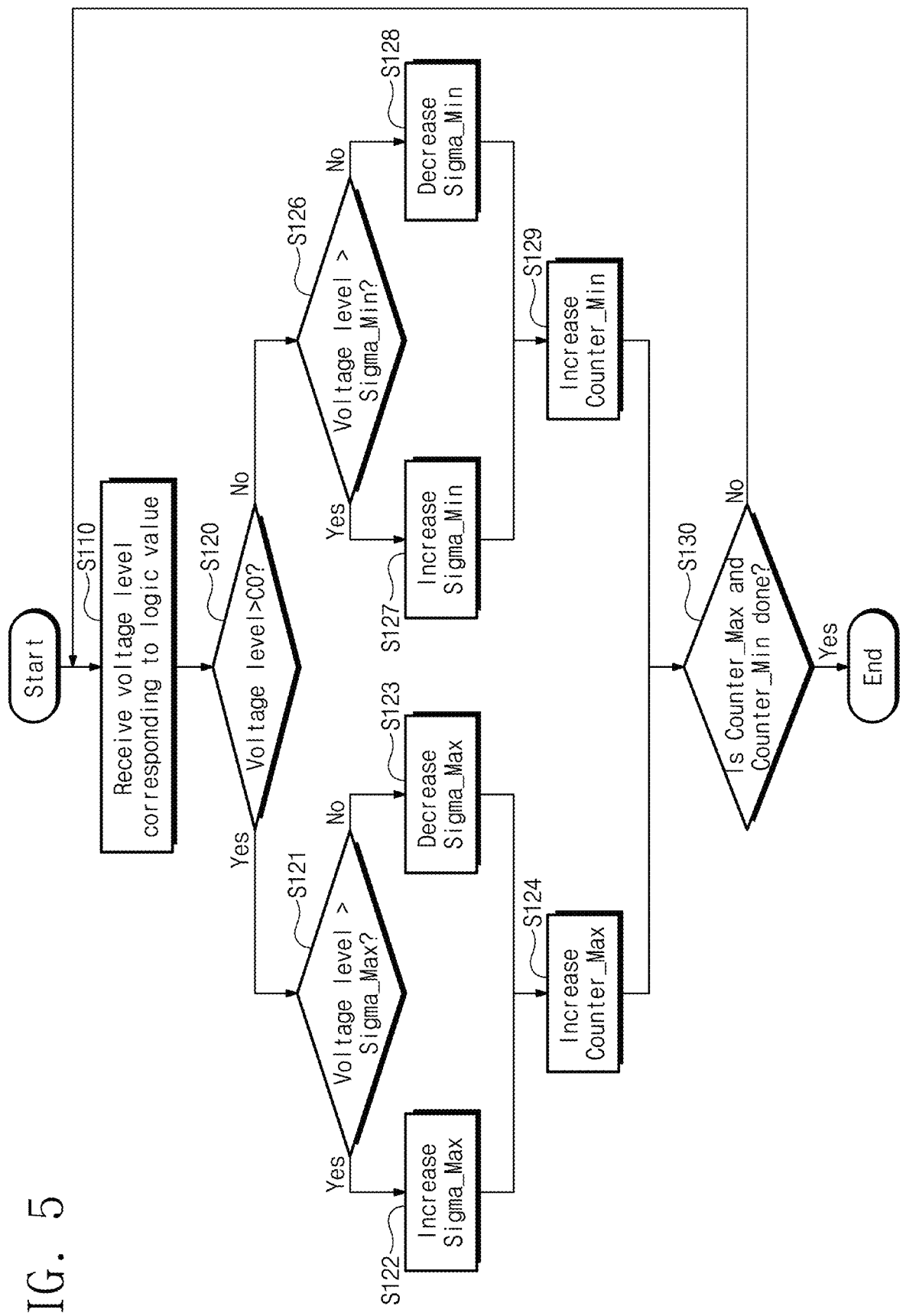
FIG. 5 is a flowchart illustrating a method in which an eye opening measurement circuit of FIG. 2 tracks a minimum sigma level and a maximum sigma level.

FIG. 5 is a flowchart illustrating a method in which an eye opening measurement circuit of FIG. 2 tracks a minimum sigma level and a maximum sigma level. FIG. 5 will be described with reference to FIG. 2.

In operation S110, the eye opening measurement circuit 160 may sequentially receive voltage levels of a signal corresponding to logical values of the output data DOUT sequentially output from the equalizer 130. In the case of the NRZ signaling scheme, the eye opening measurement circuit 160 may receive first voltage levels corresponding to the first logical value 0b and second voltage levels corresponding to the second logical value 1b. In the case of the PAM-4 signaling scheme, the eye opening measurement circuit 160 may receive first voltage levels corresponding to the first logical value 00b, second voltage levels corresponding to the second logical value 01b, third voltage levels corresponding to the third logical value 10b, and fourth voltage levels corresponding to the fourth logical value 11b.

In operation S120, the eye opening measurement circuit 160 may compare the receive voltage level with a reference voltage level. The case where the received voltage level corresponds to the second logical value 1b of the NRZ signaling scheme and the reference voltage level is the center level C0 or the case where the received voltage level corresponds to the third logical value 10b of the PAM-4 signaling scheme and the reference voltage level is the center level C0 is illustrated in FIG. 5. Of course, the eye opening measurement circuit 160 may compare the received voltage level corresponding to another logical value with another center level (i.e., S120), and may perform operation S121 to operation S124, operation S126 to operation S129, and operation S130 after operation S120.

In an embodiment, the reference voltage level C0 may be calculated by the equalizer 130 and may be provided from the equalizer 130. The equalizer 130 may accumulate equalized voltage levels while receiving a signal of data before the eye opening measurement circuit 160 starts an operation. The equalizer 130 may calculate the reference voltage level C0 by calculating an average of the accumulated voltage levels. As well as the reference voltage level C0, the equalizer 130 may also calculate another reference voltage level in a similar manner. In another embodiment, before performing operation S110, the eye opening measurement circuit 160 may calculate the reference voltage level C0 by accumulating voltage levels equalized by the equalizer 130 and calculating an average of the accumulated voltage levels. The eye opening measurement circuit 160 may further calculate another reference voltage level by using the reference voltage level C0. In another embodiment, the reference voltage level C0 may be programmed in advance to the eye opening measurement circuit 160. Another reference voltage level may also be programmed in advance to the eye opening measurement circuit 160.

In the case where the received voltage level is greater than the reference voltage level C0, operation S121 may be performed. In operation S121, the eye opening measurement circuit 160 may compare the received voltage level with a current maximum sigma level Sigma_Max. Here, the current maximum sigma level Sigma_Max may be a sigma level which is set depending on a previously received voltage level. In the case where the flowchart of FIG. 5 is performed for the first time, the current maximum sigma level Sigma_Max may be any level which is in advance set to not less than the reference voltage level C0.

In the case where the received voltage level is greater than the current maximum sigma level Sigma_Max, in operation S122, the eye opening measurement circuit 160 may increase the current maximum sigma level Sigma_Max as much as a step unit (e.g., 1 mV). In the case where the received voltage level is less than the current maximum sigma level Sigma_Max, in operation S123, the eye opening measurement circuit 160 may decrease the current maximum sigma level Sigma_Max as much as the step unit. As operation S122 and operation S123 are repeatedly performed, the maximum sigma level Sigma_Max may converge to any level which is greater than the reference voltage level C0 and is less than a maximum level of upper voltage levels. For example, the maximum sigma level Sigma_Max may converge to an average level of the upper voltage levels.

To sum up, the eye opening measurement circuit 160 may track or calculate the maximum sigma level Sigma_Max by a step unit depending on the upper voltage levels greater than the reference voltage level C0. The eye opening measurement circuit 160 may increase or decrease the current maximum sigma level Sigma_Max as much as the step unit based on a result of comparing the received voltage level with the current maximum sigma level Sigma_Max. Even though a maximum voltage level due to a transient error or noise is input to the eye opening measurement circuit 160, the eye opening measurement circuit 160 may increase the maximum sigma level Sigma_Max only as much as the step unit. The maximum sigma level Sigma_Max may represent the majority of upper voltage levels except for the maximum voltage level due to a transient error or noise. Accordingly, the tolerance of the eye opening measurement circuit 160 with regard to the transient error or noise may be improved.

In operation S124, the eye opening measurement circuit 160 may increase a maximum counter value Counter_Max. For example, the eye opening measurement circuit 160 may include a counter which increases the maximum counter value Counter_Max.

In the case where the received voltage level is less than the reference voltage level C0, operation S126 may be performed. In operation S126, the eye opening measurement circuit 160 may compare the received voltage level with a current minimum sigma level Sigma_Min. Here, the current minimum sigma level Sigma_Min may be a sigma level which is set depending on a previously received voltage level. In the case where the flowchart of FIG. 5 is performed for the first time, the current minimum sigma level Sigma_Min may be any level which is in advance set to not greater than the reference voltage level C0.

In the case where the received voltage level is greater than the current minimum sigma level Sigma_Min, in operation S127, the eye opening measurement circuit 160 may increase the current minimum sigma level Sigma_Min as much as the step unit (e.g., 1 mV). In the case where the received voltage level is less than the current minimum sigma level Sigma_Min, in operation S128, the eye opening measurement circuit 160 may decrease the current minimum sigma level Sigma_Min as much as the step unit. As operation S127 and operation S128 are repeatedly performed, the minimum sigma level Sigma_Min may converge to any level which is less than the reference voltage level C0 and is greater than a minimum level of lower voltage levels. For example, the minimum sigma level Sigma_Min may converge to an average level of the lower voltage levels.

To sum up, the eye opening measurement circuit 160 may track or calculate the minimum sigma level Sigma_Min by a step unit depending on the lower voltage levels lower than the reference voltage level C0. The eye opening measurement circuit 160 may increase or decrease the current minimum sigma level Sigma_Min as much as the step unit based on a result of comparing the received voltage level with the current minimum sigma level Sigma_Min. Even though a minimum voltage level due to a transient error or noise is input to the eye opening measurement circuit 160, the eye opening measurement circuit 160 may decrease the minimum sigma level Sigma_Min only as much as the step unit. The minimum sigma level Sigma_Min may represent the majority of lower voltage levels except for the minimum voltage level due to a transient error or noise. Accordingly, the tolerance of the eye opening measurement circuit 160 with regard to the transient error or noise may be improved.

In an embodiment, step units of operation S122, operation S123, operation S127, and operation S128 may be identical to or different from each other. The step units of operation S122, operation S123, operation S127, and operation S128 may be set in advance by the logic circuit 180.

In operation S129, the eye opening measurement circuit 160 may increase a minimum counter value Counter_Min. For example, the eye opening measurement circuit 160 may include a counter which increases the minimum counter value Counter_Min.

In operation S130, the eye opening measurement circuit 160 may determine whether the maximum counter value Counter_Max and the minimum counter value Counter_Min are done. In detail, the eye opening measurement circuit 160 may determine whether the maximum counter value Counter_Max being an output of a counter reaches a target value and whether the minimum counter value Counter_Min being an output of a counter reaches the target value. In the case where the maximum counter value Counter_Max and the minimum counter value Counter_Min are not done, the eye opening measurement circuit 160 may repeatedly perform operation S110, operation S120, operation S121 to operation S124, operation S126 to operation S129, and operation S130. For example, the eye opening measurement circuit 160 may repeatedly perform operation S110, operation S120, operation S121 to operation S124, operation S126 to operation S129, and operation S130 so that the maximum sigma level Sigma_Max represents upper voltage levels and the minimum sigma level Sigma_Min represents the lower voltage levels. The target value may be set in advance so that the maximum sigma level Sigma_Max represents the upper voltage levels and the minimum sigma level Sigma_Min represents the lower voltage levels. For example, the target value for the maximum counter value Counter_Max and the target value for the minimum counter value Counter_Min may be identical to or different from each other.

Figure 6:
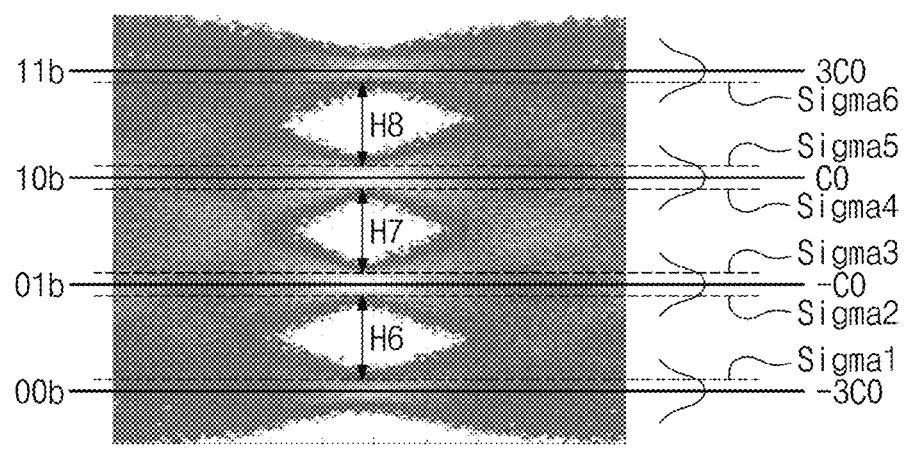
FIGS. 6 and 7 are diagrams illustrating heights of an eye opening measured by an eye opening measurement circuit of FIG. 2 according to a flowchart of FIG. 5.
Figure 7:
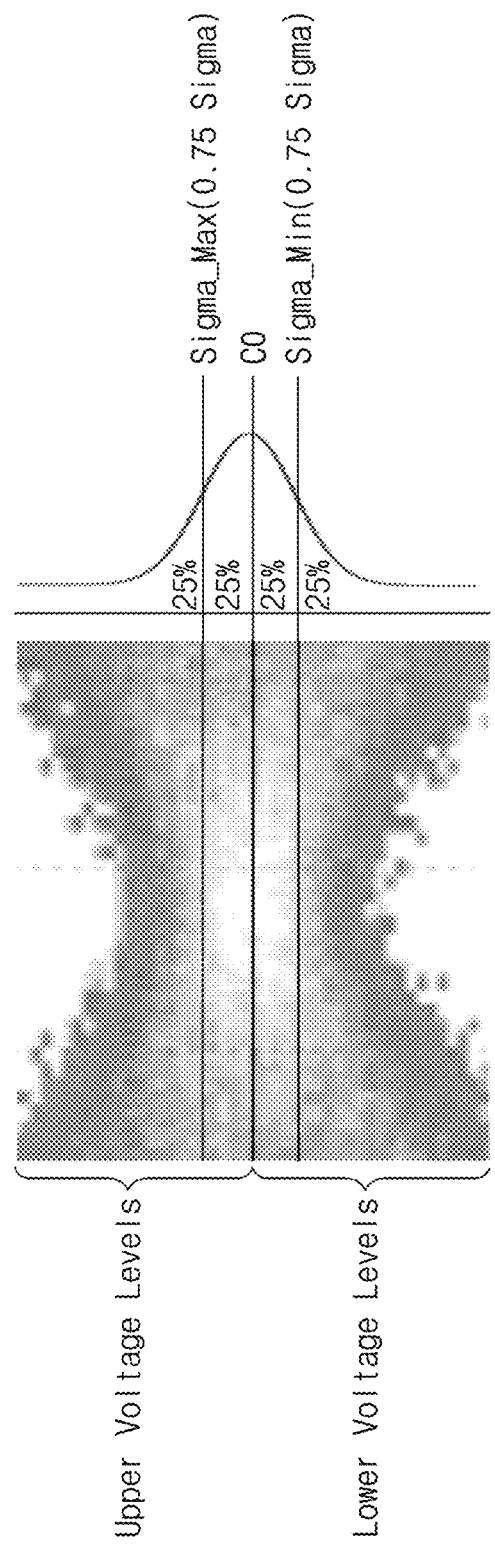

FIGS. 6 and 7 are diagram illustrating heights of an eye opening measured by an eye opening measurement circuit of FIG. 2 according to a flowchart of FIG. 5. FIGS. 6 and 7 will be described together and will be described with reference to FIGS. 2 and 5. Although not illustrated in FIGS. 6 and 7, a horizontal axis of the eye diagrams may represent time, and a vertical axis of the eye diagrams may represent a voltage level.

An eye diagram of the PAM-4 signaling scheme is illustrated in FIG. 6. The eye opening measurement circuit 160 may track first to sixth sigma levels Sigma1 to Sigma6 by repeatedly performing all operations of FIG. 5. The first sigma level Sigma1 may correspond to the first logical value 00b and may be a maximum sigma level which represents the majority of upper voltage levels greater than the reference voltage level −3C0. The second sigma level Sigma2 may correspond to the second logical value 01b and may be a minimum sigma level which represents the majority of lower voltage levels less than the reference voltage level −C0. The third sigma level Sigma3 may correspond to the second logical value 01b and may be a maximum sigma level which represents the majority of upper voltage levels greater than the reference voltage level −C0. The fourth sigma level Sigma4 may correspond to the third logical value 10b and may be a minimum sigma level which represents the majority of lower voltage levels less than the reference voltage level C0. The fifth sigma level Sigma5 may correspond to the third logical value 10b and may be a maximum sigma level which represents the majority of upper voltage levels greater than the reference voltage level C0. The sixth sigma level Sigma6 may correspond to the fourth logical value 11b and may be a minimum sigma level which represents the majority of lower voltage levels less than the reference voltage level 3C0.

The process in which the eye opening measurement circuit 160 tracks the fourth sigma level Sigma4 and the fifth sigma level Sigma5 is illustrated in FIG. 5 as representative. As described above, as in the fourth sigma level Sigma4 and the fifth sigma level Sigma5, the eye opening measurement circuit 160 may track the other sigma levels Sigma1 to Sigma3 and Sigma6, respectively.

In another embodiment, unlike illustration of FIG. 6, the eye opening measurement circuit 160 may measure a height of an eye opening of a signal which is based on the NRZ signaling scheme. In this case, as in the first to sixth sigma levels Sigma1 to Sigma6, the eye opening measurement circuit 160 may respectively track a maximum sigma level which corresponds to the first logical value 0b and represents the majority of upper voltage levels greater than the reference voltage level −C0 and a minimum sigma level which corresponds to the second logical value 1b and represents the majority of lower voltage levels less than the reference voltage level C0.

Voltage levels which are in the vicinity of the reference voltage level C0, the fourth sigma level Sigma4, and the fifth sigma level Sigma5 of FIG. 6 are enlarged and illustrated in FIG. 7. Voltage levels of FIG. 7 may correspond to the third logical value 10b.

Referring to FIG. 7, upper voltage levels greater than the reference voltage level C0 may correspond to about 50% of all voltage levels corresponding to the third logical value 10b. Lower voltage levels less than the reference voltage level C0 may correspond to about 50% of all the voltage levels corresponding to the third logical value 10b. Upper voltage levels greater than the maximum sigma level Sigma_Max (the fifth sigma level Sigma5 of FIG. 6) may correspond to about 25% of all the voltage levels corresponding to the third logical value 10b. Upper voltage levels which are less than the maximum sigma level Sigma_Max and are greater than the reference voltage level C0 may correspond to about 25% of all the voltage levels corresponding to the third logical value 10b. That is, the maximum sigma level Sigma_Max may converge to an average of the upper voltage levels. Lower voltage levels less than the minimum sigma level Sigma_Min (the fourth sigma level Sigma4 of FIG. 6) may correspond to about 25% of all the voltage levels corresponding to the third logical value 10b. Lower voltage levels which are greater than the minimum sigma level Sigma_Min and are less than the reference voltage level C0 may correspond to about 25% of all the voltage levels corresponding to the third logical value 10b. That is, the minimum sigma level Sigma_Min may converge to an average of the lower voltage levels.

Distributions of voltage levels divided with respect to the maximum sigma level Sigma_Max may be about 25% and about 75%, and the maximum sigma level Sigma_Max may correspond to a 0.75 sigma. As in the above description, distributions of voltage levels divided with respect to the minimum sigma level Sigma_Min may be about 25% and about 75%, and the minimum sigma level Sigma_Min may correspond to a 0.75 sigma.

Distributions of voltage levels divided with respect to the maximum sigma level Sigma_Max and distributions of voltage levels divided with respect to the minimum sigma level Sigma_Min are only exemplary numeric values. The eye opening measurement circuit 160 may track the maximum sigma level Sigma_Max and the minimum sigma level Sigma_Min which are different from those illustrated in FIG. 7. Also, the eye opening measurement circuit 160 may track the maximum sigma level Sigma_Max and the minimum sigma level Sigma_Min so that a deviation (difference) between the maximum sigma level Sigma_Max and the reference voltage level C0 and a deviation (difference) between the minimum sigma level Sigma_Min and the reference voltage level C0 are identical to or different from each other.

Figure 8:
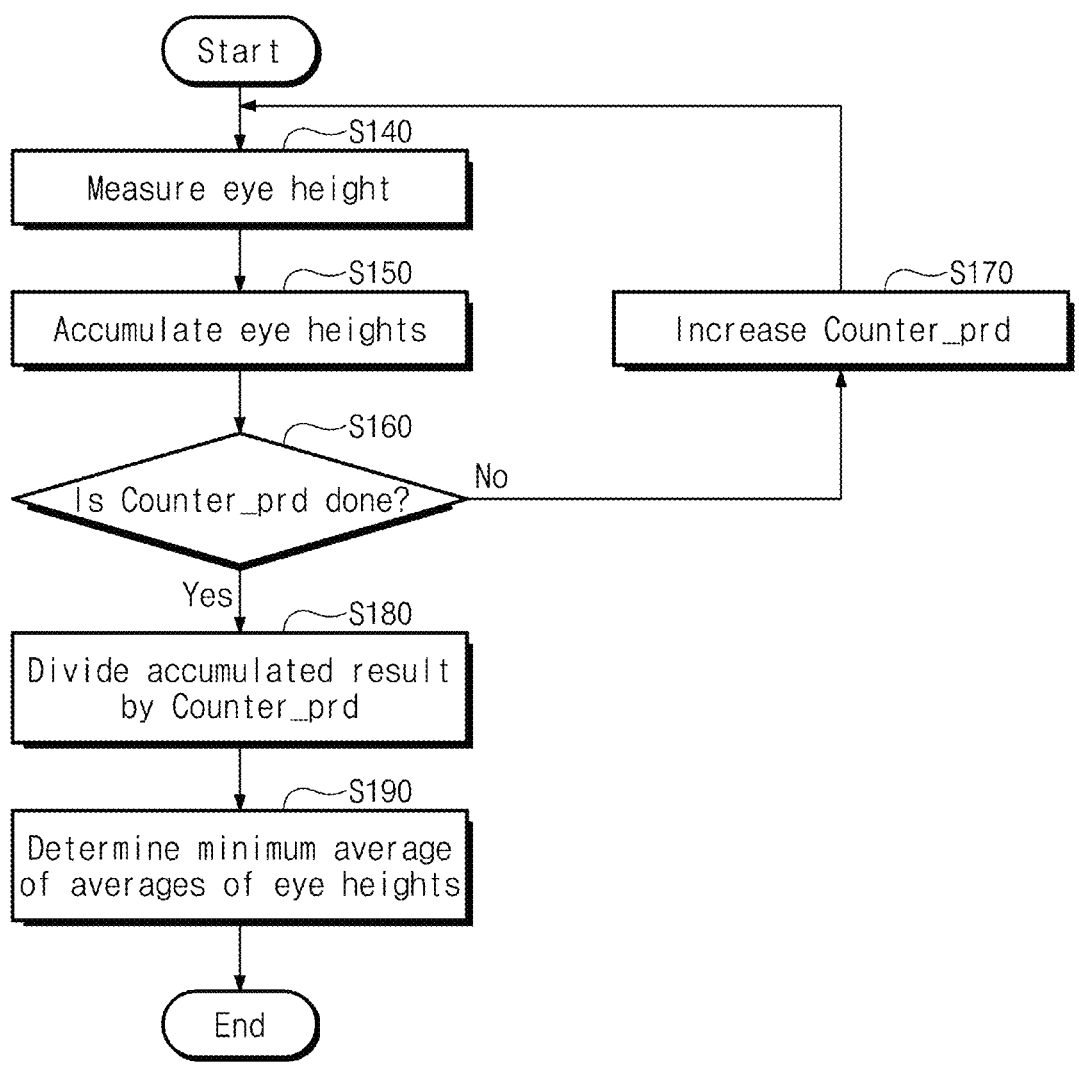
FIG. 8 is a flowchart illustrating a method in which an eye opening measurement circuit of FIG. 2 calculates a height of an eye opening.

FIG. 8 is a flowchart illustrating a method in which an eye opening measurement circuit of FIG. 2 calculates a height of an eye opening. FIG. 8 will be described with reference to FIGS. 2, 5, and 6.

Operation S140 may be performed after that the maximum counter value Counter_Max and the minimum counter value Counter_Min are done, as determined in operation S130 of FIG. 5 by the eye opening measurement circuit 160. In operation S140, the eye opening measurement circuit 160 may calculate a height of an eye opening based on the maximum sigma level Sigma_Max and the minimum sigma level Sigma_Min tracked as all operations of FIG. 5 are repeatedly performed.

For example, returning to FIG. 6, the eye opening measurement circuit 160 may calculate a difference between the first sigma level Sigma1 and the second sigma level Sigma2 and may determine a height of an eye opening between the first and second logical values 00b and 01b as H6. The eye opening measurement circuit 160 may calculate a difference between the third sigma level Sigma3 and the fourth sigma level Sigma4 and may determine a height of an eye opening between the second and third logical values 01b and 10b as H7. The eye opening measurement circuit 160 may calculate a difference between the fifth sigma level Sigma5 and the sixth sigma level Sigma6 and may determine a height of an eye opening between the third and fourth logical values 10b and 11b as H8.

Returning to FIG. 8, after the heights of the eye opening are calculated as operation S140 to operation S170 are repeatedly performed, the eye opening measurement circuit 160 may calculate an average of the heights of the eye opening. The eye opening measurement circuit 160 may calculate the average of the heights of the eye opening, thereby further improving the tolerance to a transient error or noise.

In detail, in operation S150, the eye opening measurement circuit 160 may accumulate the height of the eye opening (i.e., a difference between sigma levels) measured in operation S140. In operation S160, the eye opening measurement circuit 160 may determine whether a period counter value Counter_prd is done. For example, the eye opening measurement circuit 160 may determine whether the period counter value Counter_prd reaches a target value. The period counter value Counter_prd may indicate an iterative count of operation S140 to operation S170, and the target value may indicate a count by which the heights of the eye opening have to be accumulated to calculate the average of the heights of the eye opening. The target value may be a value determined in advance. In the case where the period counter value Counter_prd is not done, in operation S170, the eye opening measurement circuit 160 may increase the period counter value Counter_prd. The eye opening measurement circuit 160 may include a counter which increases the period counter value Counter_prd. Of course, operation S170 may be performed next after operation S150. After operation S170, the eye opening measurement circuit 160 may measure a height of a new eye opening in operation S140, may accumulate the height of the new eye opening in operation S150, and may again perform operation S160. That is, operation S140 to operation S170 may be repeatedly performed until the period counter value Counter_prd is done. Also, all the operations of FIG. 5 may be repeatedly performed for an iteration of operation S140.

In the case where the period counter value Counter_prd is done, in operation S180, the eye opening measurement circuit 160 may divide the heights of the eye opening accumulated through operation S140 to operation S170 by the period counter value Counter_prd. The eye opening measurement circuit 160 may add all the heights of the eye opening obtained through operation S140 to operation S170 and may divide a result of the accumulation (i.e., a result of the addition) by the period counter value Counter_prd.

The eye opening measurement circuit 160 may accumulate the heights of the eye opening between the first and second logical values 00b and 01b and may calculate an average of the accumulated heights. The eye opening measurement circuit 160 may accumulate the heights of the eye opening between the second and third logical values 01b and 10b and may calculate an average of the accumulated heights. The eye opening measurement circuit 160 may accumulate the heights of the eye opening between the third and fourth logical values 10b and 11b and may calculate an average of the accumulated heights. The above-described exemplification may be associated with the PAM-4 signaling scheme. In the case of the NRZ signaling scheme, the eye opening measurement circuit 160 may accumulate heights of an eye opening between the first and second logical values 0b and 1b and may calculate an average of the accumulated heights.

In operation S190, the eye opening measurement circuit 160 may determine a minimum average of the average of the heights of the eye opening between the first and second logical values 00b and 01b, the average of the heights of the eye opening between the second and third logical values 01b and 10b, and the average of the heights of the eye opening between the third and fourth logical values 10b and 11b. The eye opening measurement circuit 160 may provide the minimum average to the logic circuit 180. Operation S190 may be associated with the PAM-4 signaling scheme. In the case of the NRZ signaling scheme, the eye opening measurement circuit 160 may provide an average of heights of an eye opening between the first and second logical values 0b and 1b calculated in operation S180 to the logic circuit 180 without performing operation S190.

Figure 9:
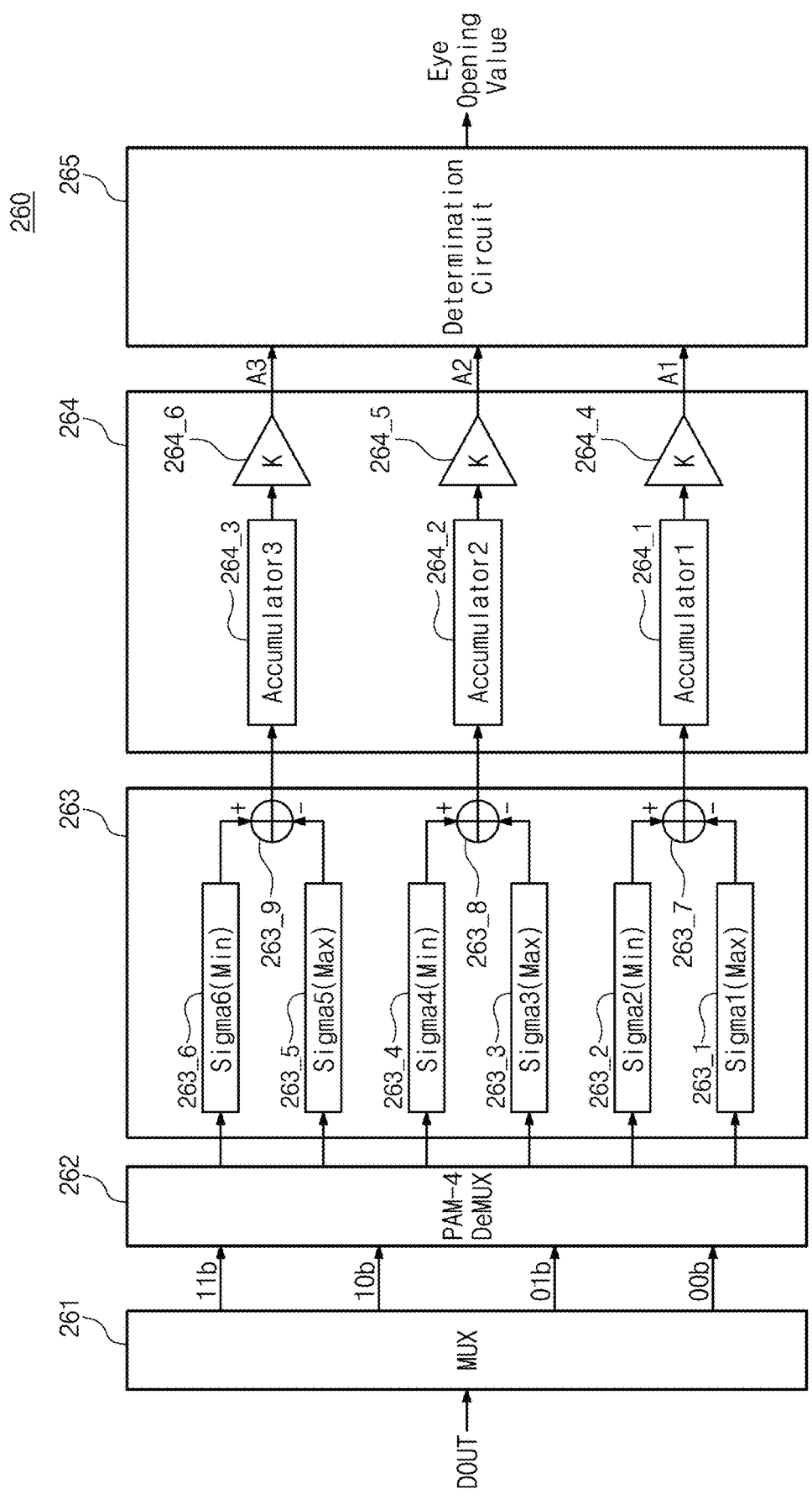
FIG. 9 is a block diagram illustrating an eye opening measurement circuit of FIG. 2 based on a PAM-4 signaling scheme.

FIG. 9 is a block diagram illustrating an eye opening measurement circuit of FIG. 2 based on a PAM-4 signaling scheme. FIG. 9 will be described with reference to FIGS. 2, 5, 6, and 8. An eye opening measurement circuit 260 may include a multiplexer 261, a PAM-4 demultiplexer 262, a difference calculator 263, an average calculator 264, and a determination circuit 265.

The multiplexer 261 may receive voltage levels of the output data DOUT provided from the equalizer 130. The multiplexer 261 may perform operation S110 of FIG. 5. Here, the voltage levels of the output data DOUT provided from the equalizer 130 may be provided through at least one channel between the equalizer 130 and the eye opening measurement circuit 260. The multiplexer 261 may multiplex the voltage levels of the output data DOUT depending on the first to fourth logical values 00b, 01b, 10b, and 11b of the output data DOUT. That is, the multiplexer 261 may provide voltage levels corresponding to the first logical value 00b to the PAM-4 demultiplexer 262, voltage levels corresponding to the second logical value 01b to the PAM-4 demultiplexer 262, voltage levels corresponding to the third logical value 10b to the PAM-4 demultiplexer 262, and voltage levels corresponding to the fourth logical value 11b to the PAM-4 demultiplexer 262.

The PAM-4 demultiplexer 262 may demultiplex the voltage levels corresponding to the first to fourth logical values 00b, 01b, 10b, and 11b. The PAM-4 demultiplexer 262 may perform operation S120 to operation S130 of FIG. 5. For example, the PAM-4 demultiplexer 262 may include a comparator to compare a received voltage level with a reference voltage level, a comparator to compare the received voltage level with a current maximum sigma level, a comparator to compare the received voltage level with a current minimum sigma level, an adder (or a subtractor) to increase or decrease a maximum sigma level as much as a step unit, and an adder (or a subtractor) to increase or decrease a minimum sigma level as much as the step unit. The PAM-4 demultiplexer 262 may track the first to sixth sigma levels Sigma1 to Sigma6 depending on operation S120 to operation S130 and may update or store an intermediate result of the tracking and a final result of the tracking to first to sixth registers 263_1 to 263_6 of the difference calculator 263.

The difference calculator 263 may include the first to sixth registers 263_1 to 263_6 and first to third adders 263_7 to 263_9. As described above, the first to sixth registers 263_1 to 263_6 may store first to sixth final sigma levels Sigma1 to Sigma6 updated by the PAM-4 demultiplexer 262. Unlike the illustration of FIG. 9, the first to sixth registers 263_1 to 263_6 may be included in the PAM-4 demultiplexer 262.

The difference calculator 263 may perform operation S140 of FIG. 8. The difference calculator 263 may calculate a difference between a maximum sigma level and a minimum sigma level. In detail, the first adder 263_7 may calculate a difference between the first and second sigma levels Sigma1 and Sigma2 and may calculate a height (refer to H6 of FIG. 6) of an eye opening between the first and second logical values 00b and 01b. The second adder 263_8 may calculate a difference between the third and fourth sigma levels Sigma3 and Sigma4 and may calculate a height (refer to H7 of FIG. 6) of an eye opening between the second and third logical values 01b and 10b. The third adder 263_9 may calculate a difference between the fifth and sixth sigma levels Sigma5 and Sigma6 and may calculate a height (refer to H8 of FIG. 6) of an eye opening between the third and fourth logical values 10b and 11b. For example, the first to third adders 263_7 to 263_9 may be subtractors to calculate a difference between sigma levels.

The average calculator 264 may include first to third accumulators 264_1 to 264_3 and first to third dividers 264_4 to 264_6. Each of the first to third accumulators 264_1 to 264_3 may perform operation S150 of FIG. 8. The first accumulator 264_1 may accumulate or add the heights of the eye opening between the first and second logical values 00b and 01b. The second accumulator 264_2 may accumulate and add the heights of the eye opening between the second and third logical values 01b and 10b. The third accumulator 264_3 may accumulate and add the heights of the eye opening between the third and fourth logical values 10b and 11b.

Each of the first to third dividers 264_4 to 264_6 may perform operation S180 of FIG. 8. The first divider 264_4 may divide an accumulation result of the first accumulator 264_1 by "K" (the period counter value Counter_prd of FIG. 8 or an accumulation count) and may calculate a first average A1 of the heights of the eye opening between the first and second logical values 00b and 01b. The second divider 264_5 may divide an accumulation result of the second accumulator 264_2 by "K" and may calculate a second average A2 of the heights of the eye opening between the second and third logical values 01b and 10b. The third divider 264_6 may divide an accumulation result of the third accumulator 264_3 by "K" and may calculate a third average A3 of the heights of the eye opening between the third and fourth logical values 10b and 11b.

The determination circuit 265 may perform operation S190 of FIG. 8. The determination circuit 265 may provide, as an eye opening value, a minimum average of the first to third averages A1 to A3 to the logic circuit 180. For example, the determination circuit 265 may include at least one comparator for comparing the first to third averages A1 to A3.

Figure 10:
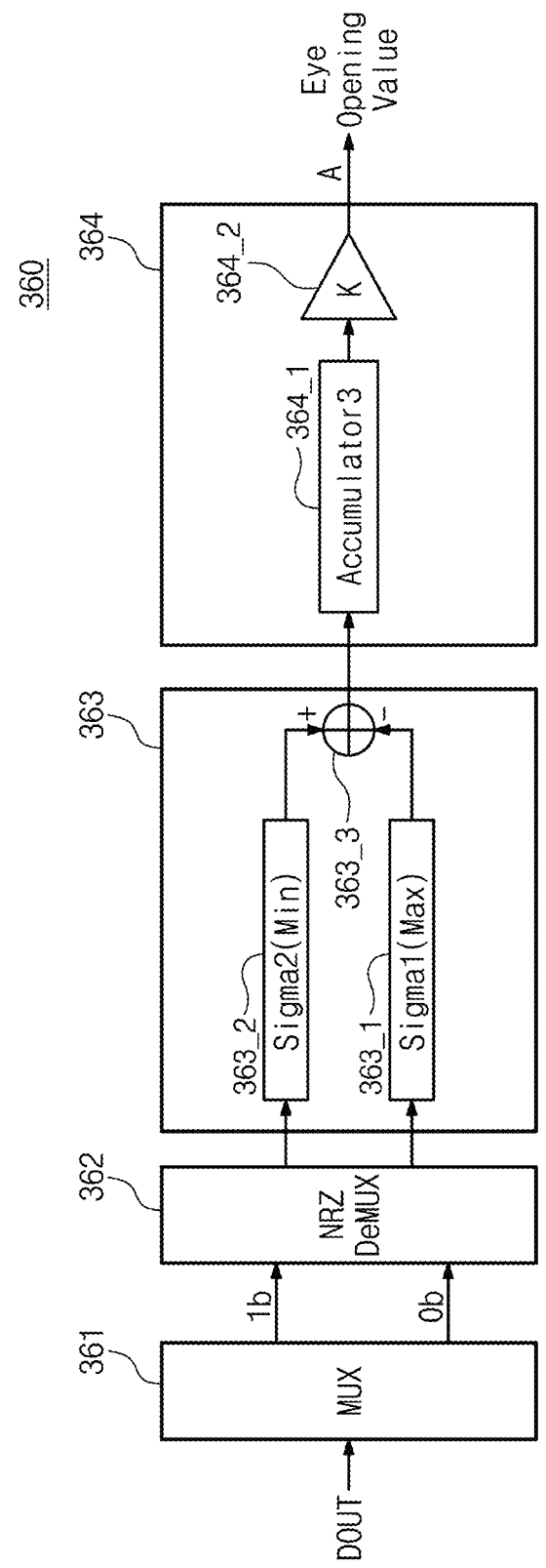
FIG. 10 is a block diagram illustrating an eye opening measurement circuit of FIG. 2 based on an NRZ signaling scheme.

FIG. 10 is a block diagram illustrating an eye opening measurement circuit of FIG. 2 based on an NRZ signaling scheme. FIG. 10 will be described with reference to FIGS. 2, 5, 8, and 9. An eye opening measurement circuit 360 may include a multiplexer 361, an NRZ demultiplexer 362, a difference calculator 363, and an average calculator 364.

An operation of the multiplexer 361 may be similar to the operation of the multiplexer 261 of FIG. 9. The multiplexer 361 may multiplex the voltage levels of the output data DOUT depending on the first and second logical values 0b and 1b of the output data DOUT. The multiplexer 361 may perform operation S110 of FIG. 5. The multiplexer 361 may provide voltage levels corresponding to the first logical value 0b to the NRZ demultiplexer 362 and may provide voltage levels corresponding to the second logical value 1b to the NRZ demultiplexer 362.

An operation of the NRZ demultiplexer 362 may be similar to the operation of the PAM-4 demultiplexer 262 of FIG. 9. The NRZ demultiplexer 362 may demultiplex the voltage levels corresponding to the first and second logical values 0b and 1b. The NRZ demultiplexer 362 may perform operation S120 to operation S130 of FIG. 5. For example, the NRZ demultiplexer 362 may include a comparator to compare a received voltage level with a reference voltage level, a comparator to compare the received voltage level with a current maximum sigma level, a comparator to compare the received voltage level with a current minimum sigma level, an adder (or a subtractor) to increase or decrease a maximum sigma level as much as a step unit, and an adder (or a subtractor) to increase or decrease a minimum sigma level as much as the step unit. The NRZ demultiplexer 362 may track the first and second sigma levels Sigma1 and Sigma2 depending on operation S120 to operation S130 and may update or store an intermediate result of the tracking and a final result of the tracking to first and second registers 363_1 and 363_2 of the difference calculator 363.

An operation of the difference calculator 363 may be similar to the operation of the difference calculator 263 of FIG. 9. The difference calculator 363 may include first and second registers 363_1 and 363_2 and an adder 363_3. As described above, the first and second registers 363_1 and 363_2 may store first and second final sigma levels Sigma1 and Sigma2 updated by the NRZ demultiplexer 362. Unlike the illustration of FIG. 10, the first and second registers 363_1 and 363_2 may be included in the NRZ demultiplexer 362.

The difference calculator 363 may perform operation S140 of FIG. 8. The difference calculator 363 may calculate a difference between a maximum sigma level and a minimum sigma level. In detail, the adder 363_3 may calculate a difference between the first and second sigma levels Sigma1 and Sigma2 and may calculate a height of an eye opening between the first and second logical values 0b and 1b. The adder 363_3 may be a subtractor to calculate a difference between sigma levels.

An operation of the average calculator 364 may be similar to the operation of the average calculator 264 of FIG. 9. The average calculator 364 may include an accumulator 364_1 and a divider 364_2. The accumulator 364_1 may perform operation S150 of FIG. 8. The accumulator 364_1 may accumulate or add the heights of the eye opening between the first and second logical values 0b and 1b. The divider 364_2 may perform operation S180 of FIG. 8. The divider 364_2 may divide an accumulation result of the accumulator 364_1 by "K" (the period counter value Counter_prd of FIG. 8 or an accumulation count) and may calculate an average "A" of the heights of the eye opening between the first and second logical values 0b and 1b. The eye opening measurement circuit 360 may not include the determination circuit 265 of FIG. 9 and may provide, as an eye opening value, the average "A" of the heights of the eye opening directly to the logic circuit 180.

Figure 11:
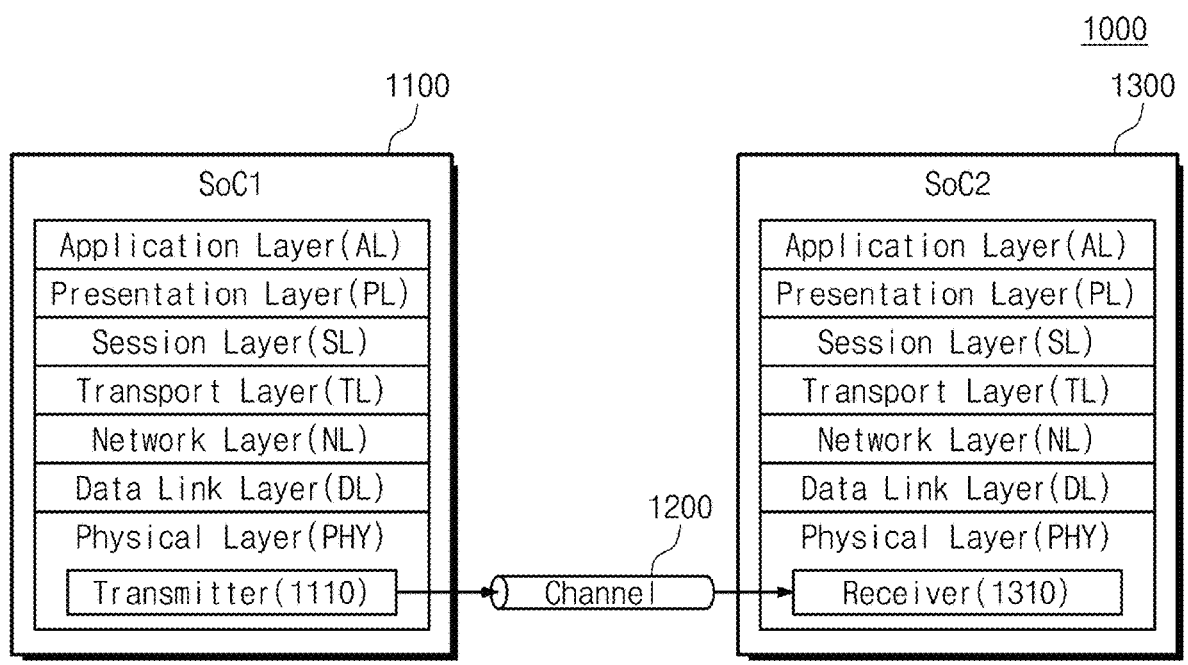
FIG. 11 is a block diagram illustrating an electronic device including an SoC to which a receiver according to an embodiment of the disclosure is applied and another SoC communicating with the SoC.

FIG. 11 is a block diagram illustrating an electronic device including an SoC to which a receiver according to an embodiment of the disclosure is applied and another SoC communicating with the SoC. An electronic device 1000 may include a first SoC 1100 and a second SoC 1300.

In an embodiment, the first and second SoCs 1100 and 1300 may communicate with each other based on the open system interconnection (OSI) 7-layer structure proposed in the international standard organization. For example, each of the first and second SoCs 1100 and 1300 may include an application layer AL, a presentation layer PL, a session layer SL, a transport layer TL, a network layer NL, a data link layer DL, and a physical layer PHY.

The layers of the first SoC 1100 may physically or logically communicate with the corresponding layers of the second SoC 1300. The application layer AL, the presentation layer PL, the session layer SL, the transport layer TL, the network layer NL, the data link layer DL, and the physical layer PHY of the first SoC 1100 may logically or physically communicate with the application layer AL, the presentation layer PL, the session layer SL, the transport layer TL, the network layer NL, the data link layer DL, and the physical layer PHY of the second SoC 1300, respectively.

In an embodiment, the physical layer PHY of the first SoC 1100 may include a transmitter 1110. The transmitter 1110 may be implemented within the physical layer PHY of the first SoC 1100. The transmitter 1110 may be the transmitter 11 of FIG. 1. The physical layer PHY of the second SoC 1300 may include a receiver 1310. The receiver 1310 may be implemented within the physical layer PHY of the second SoC 1300. The receiver 1310 may be the receiver 13 of FIG. 1 or the receiver 100 of FIG. 2 including the eye opening measurement circuit 160.

The transmitter 1110 of the first SoC 1100 may transmit a signal to the receiver 1310 of the second SoC 1300 through a channel 1200. The channel 1200 may be the channel 12 of FIG. 1. The receiver 1310 may include the eye opening measurement circuit 160 of FIG. 2, and the eye opening measurement circuit 160 of FIG. 2 may measure a height of an eye opening based on a maximum sigma level and a minimum sigma level.

An eye opening measurement circuit according to an embodiment of the disclosure and a receiver including the same may track sigma levels for each step unit depending on voltage levels of a signal and may measure an eye opening of the signal based on converged sigma levels, not a minimum voltage level and a maximum voltage level. According to an embodiment of the disclosure, since a height of an eye opening is prevented from decreasing due to a transient error or noise, the tolerance to the transient error or noise may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A receiver comprising:
an equalizer that generates an equalized signal by equalizing a signal with a multi-tap filter to compensate for an effect of communicating the signal through a channel;
a measurement circuit that generates a quality measure of the equalization applied to the signal by measuring the equalized signal; and
a logic circuit that adjusts a coefficient of a tap of the multi-tap filter of the equalizer, based upon the quality measure,
wherein the quality measure is based on differences between: (1) first representations of a first symbol within the equalized signal and (2) second representations of a second symbol within the equalized signal.

2. The receiver of claim 1, wherein the quality measure is based on an average of the differences.

3. The receiver of claim 1, wherein:
each of the first representations is centered among third representations, of instances of the first symbol within the equalized signal, having magnitudes that are less than a first reference value, and
each of the second representations is centered among fourth representations, of instances of the second symbol within the equalized signal, having magnitudes that are greater than a second reference value.

4. The receiver of claim 3, wherein:
the first reference value is a center level of the instances of the first symbol; and
the second reference value is a center level of the instances of the second symbol.

5. The receiver of claim 4, wherein:
each of the first representations is greater than a minimum level of the instances of the first symbol; and
each of the second representations is less than a maximum level of the instances of the second symbol.

6. The receiver of claim 1, wherein the differences are first differences, and the quality measure is further based on:
second differences between: (3) third representations of the second symbol within the equalized signal and (4) fourth representations of a third symbol within the equalized signal.

7. The receiver of claim 6, wherein the quality measure is based on a minimum value between an average of the first differences and an average of the second differences.

8. The receiver of claim 6, wherein:
each of the first representations is centered among fifth representations, of instances of the first symbol within the equalized signal, having magnitudes that are less than a first reference value,
each of the second representations is centered among sixth representations, of instances of the second symbol within the equalized signal, having magnitudes that are greater than a second reference value,
each of the third representations is centered among seventh representations, of instances of the second symbol within the equalized signal, having magnitudes that are less than the second reference value, and
each of the fourth representations is centered among eighth representations, of instances of the third symbol within the equalized signal, having magnitudes that are greater than a third reference value.

9. The receiver of claim 1, wherein:
each of the first representation is greater than a minimum level of the instances of the first symbol;
each of the second representation is less than a maximum level of the instances of the second symbol,
a first distribution of voltage levels divided with respect to the minimum level of the instances of the first symbol is 25%, and
a second distribution of voltage levels divided with respect to the maximum level of the instances of the second symbol is 75%.

10. The receiver of claim 1, wherein the differences are first differences, and the quality measure is further based on:
second differences between: (3) third representations of the second symbol within the equalized signal and (4) fourth representations of a third symbol within the equalized signal, and
third differences between: (5) fifth representations of the third symbol within the equalized signal and (6) sixth representations of a fourth symbol within the equalized signal,
wherein the signal is communicated through the channel based on a four-level pulse amplitude modulation (PAM-4) signaling scheme,
the first symbol is corresponding to a first logic value,
the second symbol is corresponding to a second logic value,
the third symbol is corresponding to a third logic value, and
the fourth symbol is corresponding to a fourth logic value.

11. An electronic circuit comprising:
a multiplexer that receives a signal including a serial transmission of instances of a first symbol and instances of a second symbol and conveys the instances of the first symbol to a first register and conveys the instances of the second symbol to a second register; and
a processor circuit including the first register, the second register and an first adder, and for each of a plurality of iterations:
the first register stores a first representation that is centered among second representations of the instances of the first symbol within the signal having magnitudes that are less than a first reference value,
the second register stores a third representation that is centered among fourth representations of the instances of the second symbol within the signal having magnitudes that are greater than a second reference value, and
the first adder generates a first difference between the first representation and the third representation.

12. The electronic circuit of claim 11, wherein:
the processor circuit further includes a third register, a fourth register, and a second adder,
the serial transmission further includes instances of a third symbol and the multiplexer conveys the instances of the second symbol to the third register and conveys the instances of the third symbol to the fourth register, and
for each of the iterations:
the third register stores a fifth representation that is centered among sixth representations of the instances of the second symbol within the signal having magnitudes that are less than the second reference value,
the fourth register stores a seventh representation that is centered among eighth representations of the instances of the third symbol within the signal having magnitudes that are greater than a third reference value, and the second adder generates a second difference between the fifth representation and the seventh representation.

13. The electronic circuit of claim 12, wherein:

the processor circuit further includes a fifth register, a sixth register, and a third adder, the serial transmission further includes instances of a fourth symbol and the multiplexer conveys the instances of the third symbol to the fifth register and conveys the instances of the fourth symbol to the sixth register, and for each of the iterations:

the fifth register stores a ninth representation that is centered among tenth representations of the instances of the third symbol within the signal having magnitudes that are less than the third reference value, the sixth register stores an eleventh representation that is centered among twelfth representations of the instances of the fourth symbol within the signal having magnitudes that are greater than a fourth reference value, and the third adder generates a third difference between the ninth representation and the eleventh representation.

14. The electronic circuit of claim 12, wherein the processor circuit:

generates an average of the first difference over the iterations and an average of the second difference over the iterations, and outputs a lesser of the average of the first difference and the average of the second difference as an indicator of equalization quality within the signal.

15. A data transmission system comprising:

a first chip including a transmitter; and a second chip including a receiver connected to the transmitter through a channel;

wherein the receiver includes:

an equalizer that generates an equalized signal by equalizing the signal using a multi-tap filter to compensate for an effect of communicating the signal through the channel;

an eye opening measurement circuit that calculates a difference between a first sigma level of first voltage levels corresponding to a first logical value of the equalized signal, and a second sigma level of second voltage levels corresponding to a second logical value of the equalized signal; and a logic circuit that adjusts a coefficient of a tap of the multi-tap filter of the equalizer, based on the difference.

16. The data transmission system of claim 15, wherein:

the first sigma level is less than a maximum level of the first voltage levels, the second sigma level is greater than a minimum level of the second voltage levels, and the difference between the first sigma level and the second sigma level is greater than a difference between the minimum level and the maximum level.

17. The data transmission system of claim 15, wherein the receiver further includes:

an analog front end that receives the signal transmitted through the channel from the transmitter;

a sampler that samples the signal provided from the analog front end based on a sampling clock;

a clock and data recovery circuit that recovers the sampling clock, based on the equalized signal and clocks;

a clock generator that generates the clocks having multiple phases and provides the clocks to the clock and data recovery circuit; and a decoder that decodes the first and second voltage levels to first and second symbols and provides the first and second symbols to the logic circuit.

18. The data transmission system of claim 17, wherein the logic circuit further adjusts the clock and data recovery circuit based on the difference.

19. The data transmission system of claim 15, wherein the eye opening measurement circuit that:

tracks the first sigma level by a first step unit depending on upper voltage levels, which are greater than a first reference voltage level, from among the first voltage levels; and tracks the second sigma level by a second step unit depending on lower voltage levels, which are less than a second reference voltage level, from among the second voltage levels.

20. The data transmission system of claim 19, wherein:

the first reference voltage is a center level of the first voltage levels, the second reference voltage level is a center level of the second voltage levels, the first sigma level is converged to an average level of the upper voltage levels, and the second sigma level is converged to an average level of the lower voltage levels.

* * * * *